US006847919B2

(12) United States Patent
Zhang et al.

(10) Patent No.: US 6,847,919 B2
(45) Date of Patent: Jan. 25, 2005

(54) CHARACTERIZING AN EXPOSURE TOOL FOR PATTERNING A WAFER

(75) Inventors: Guohong Zhang, Plano, TX (US); Changan Wang, Plano, TX (US); Stephen J. DeMoor, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 161 days.

(21) Appl. No.: 10/370,944

(22) Filed: Feb. 21, 2003

(65) Prior Publication Data

US 2004/0167748 A1 Aug. 26, 2004

(51) Int. Cl.$^7$ .............................. G06F 11/30
(52) U.S. Cl. .................. 702/185; 355/53; 355/55
(58) Field of Search .................. 702/81, 155, 185; 250/201.2, 548; 355/30, 52, 53, 67, 69; 356/121, 124, 237.1, 237.2, 237.4, 399, 401

(56) References Cited

PUBLICATIONS

I. Grodnensky, et al., "Evaluation of lithographic imaging performance by optical area measurement", Nikon Precision Inc., Belmont, CA, 6 total pages.

T. Hagiwara, et al., "A Method to Predict CD Variation Caused by Dynamic Scanning Focus Errors", Optical Microlithography XIV, Christopher J. Progler, Editor, Proceedings of SPIE vol. 4346, 2001 SPIE 0277–786X/01, pp. 408–413.

C. Progler, et al., "Potential causes of across field CD variation", SPIE vol. 3051; 0277–786X/97, pp. 660–671, 1997.

D. Flagello, et al., "Towards A Comprehensive Control Of Full–Field Image Quality In Optical Photolithography", ASM Lithography BV, The Netherlands, pp. 1–14.

*Primary Examiner*—John Barlow
*Assistant Examiner*—Stephen J. Cherry
(74) *Attorney, Agent, or Firm*—Jacqueline J. Garner; W. James Brady, III; Frederick J. Telecky, Jr.

(57) ABSTRACT

Characterizing an exposure tool involves receiving data describing a pattern formed at a wafer. The pattern is formed by illuminating the wafer using an exposure tool, and the data has a scan direction and slit direction. An image field is mapped according to the data to determine an image field error of the data, and the image field error is separated from the data to reduce variation of the data in the scan direction. The data is reduced to the slit direction. Errors associated with the exposure tool are determined from the data in order to characterize the exposure tool.

20 Claims, 2 Drawing Sheets

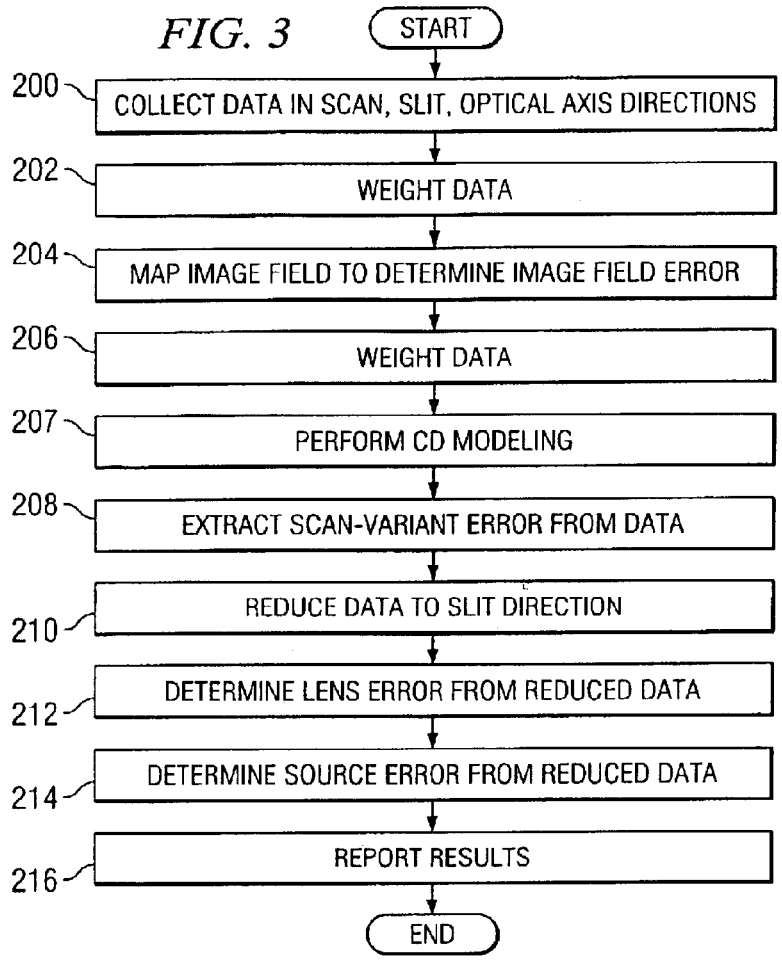
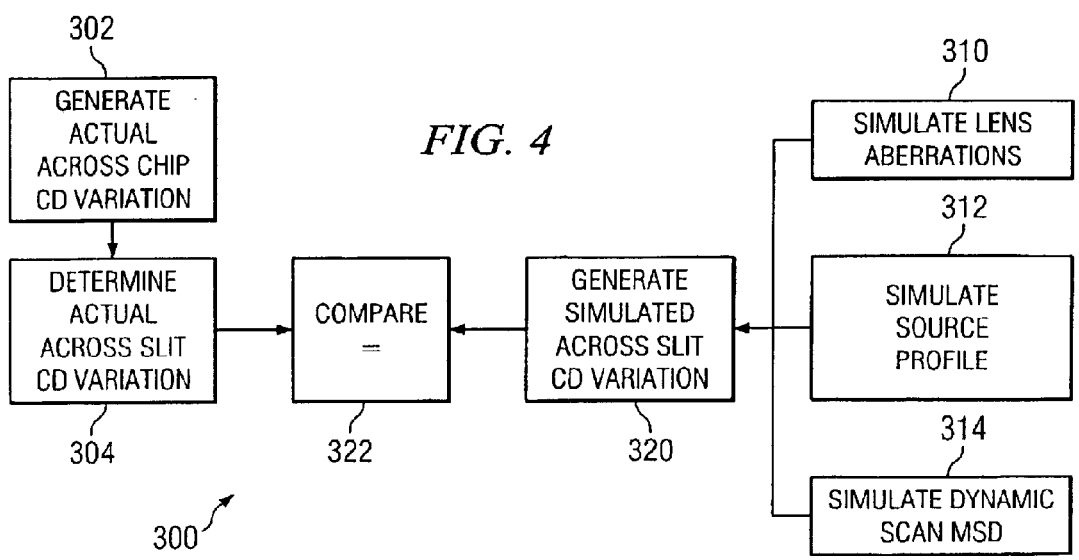

CHARACTERIZING AN EXPOSURE TOOL FOR PATTERNING A WAFER

TECHNICAL FIELD OF THE INVENTION

This invention relates generally to the field of integrated circuits and more specifically to characterizing an exposure tool for patterning a wafer.

BACKGROUND OF THE INVENTION

Exposure tools are used in photolithography to define patterns on objects such as integrated circuits. Exposure tools, however, may introduce errors that cause the resulting pattern defined on the object to differ from the intended pattern. For example, an astigmatism of a projection lens of an exposure tool may cause the resulting pattern to differ from the intended pattern. Known techniques characterize an exposure tool by describing the errors introduced by the exposure tool in order to compensate for these errors. Known techniques for characterizing an exposure tool, however, are typically inefficient and can be inaccurate. Consequently, known techniques for characterizing an exposure tool may be unsatisfactory in certain situations.

SUMMARY OF THE INVENTION

In accordance with the present invention, disadvantages and problems associated with previous techniques for characterizing an exposure tool may be reduced or eliminated.

According to one embodiment of the present invention, characterizing an exposure tool involves receiving data describing a pattern formed at a wafer. The pattern is formed by illuminating the wafer using an exposure tool, and the data has a scan direction and slit direction. An image field is mapped according to the data to determine an image field error of the data, and the image field error is separated from the data to reduce variation of the data in the scan direction due to scan dynamics. The data is reduced to the slit direction. Errors associated with the exposure tool are determined from the data in order to characterize the exposure tool.

Certain embodiments of the invention may provide one or more technical advantages. A technical advantage of one embodiment may be that critical dimension errors are correlated with causal factors such as scan dynamics, illumination uniformity, and lens aberrations. The contribution of each of these factors to the critical dimension errors may be quantified in order to allow for effective correction of these errors.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIG. 3 is a flowchart illustrating one embodiment of a method for characterizing an exposure tool; and FIG. 4 is a diagram illustrating an example context in which the method of FIG. 3 may be utilized.

DETAILED DESCRIPTION OF THE DRAWINGS

Embodiments of the present invention and its advantages are best understood by referring to FIGS. 1 through 4 of the drawings, like numerals being used for like and corresponding parts of the various drawings.

Figure 1:
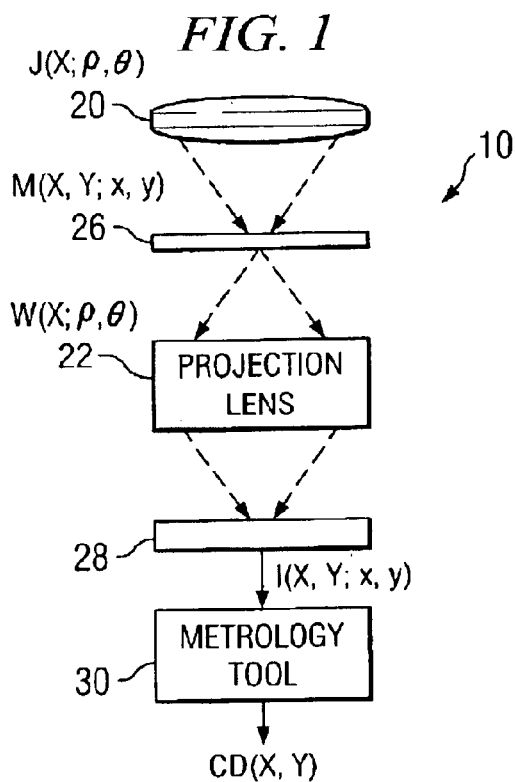
FIG. 1 is a diagram illustrating an exposure tool that may be characterized according to one embodiment of the present invention.

FIG. 1 is a diagram illustrating an exposure tool 10 that may be characterized according to one embodiment of the present invention. In general, exposure tool 10 is used to create a pattern on a wafer. Data describing the resulting pattern, such as critical dimensions (CD) of the pattern, is collected in scan and slit directions, and reduced to the slit direction. Errors such as CD errors due to different components of the exposure tool 10 are extracted from the data in order to characterize exposure tool 10.

According to the illustrated embodiment, exposure tool 10 defines a pattern on a wafer 28 by illuminating successive portions of wafer 28. In the illustrated example, patterning of a specific structure such as a line and space grating at a micro-scale is described, followed by a description of patterning of the same structure over a full exposure field. Typically, exposure tool 10 illuminates a slit portion, which may be long and thin, through a slit, and then moves to a next slit portion.

For a field of wafer 28 patterned by one exposure, X may be used to represent the slit direction, which may be described as the lengthwise direction of the slit portion, and Y may be used to represent the scan direction, which may be described as the direction in which the exposure tool 10 moves in order to pattern a field on wafer 28. For a local portion of wafer 28 at a micro-scale such as an area of less than 100 microns in dimension, x may be used to represent the slit direction, and y may be used to represent the scan direction.

Exposure tool 10 includes an illumination source 20 and a projection lens 22, which are used with a mask 26 to define a pattern on wafer 28. Source 20 illuminates mask 26, and may comprise any device suitable for illuminating mask 26, for example, a laser or condenser optics. The illumination provided by source 20 may be described by an energy dose E(X), which may vary across slit direction X. Characteristics such as the radiance distribution of source 20 may be described by source data represented by a radiance function $J(X; \rho, \theta)$, where $\rho$ represents a radial direction, and $\theta$ represents an angular direction defined at the exit pupil of projection lens 22. $J(X; \rho, \theta)$ may vary across the slit direction X.

Mask 26 defines the pattern to be formed at wafer 28, and may comprise any template suitable for defining a pattern such as a line and space grating pattern. Characteristics of mask 26 such as the two-dimensional layout of the pattern may be described using mask data represented by a mask function $M(X, Y; x, y)$ at any field location $(X, Y)$.

Projection lens 22 collects light diffracted from mask 26 to wafer 28, and may comprise any device suitable for collecting diffracted light, for example, 4× reduction lens optics. At any one time, projection lens 22 typically patterns a substantially rectangular portion of wafer 28. Characteristics of projection lens 22 such as aberrations may be described by lens data represented by a lens aberration function $W(X; \rho, \theta)$, where $\rho$ represents a radial direction and $\theta$ represents an angular direction defined at the exit pupil of projection lens 22. Lens aberration W(X; ρ, θ) may vary across the slit direction X.

The image comprising a pattern is formed at wafer 28, which may comprise any material on which an image may be formed, for example, silicon. For data analysis purposes, wafer 28 may comprise a very flat double-polished wafer having a thickness of approximately 620 microns with a local thickness variation of less than 0.2 microns.

The resulting image formed at a field location (X, Y) of wafer 28 may be described by an image function typically defined in terms of a critical dimension CD(X, Y) according to Equation (1):

$$CD(X, Y) = R\{I(X, Y; x, y) \otimes MSD(Y), E(X), \Delta Z(X, Y)\} \quad (1)$$

where R represents an image transfer to a light sensitive media such as a photo resist, and MSD(Y) represents the scan synchronization error from the electro-mechanics of exposure tool 10. Typically, such electro-mechanical variations of exposure tool 10 or wafer 28 may cause the image to be formed at various positions in the Z direction along the optical axis across an exposure field. The variation in the Z direction may be described by the dynamic image field deviation represented by ΔZ(X, Y).

Function I(X, Y; x, y) represents the optical image that may be described by Equation (2):

$$I(X, Y; x, y) = \quad (2)$$
$$|F^{-1}\{F\{M(X, Y; x, y)\} \otimes S(X; \rho, \theta) \cdot P(\rho, \theta) \cdot \exp[-iW(X; \rho, \theta)]\}|^2$$

where F represents a Fourier transform, $F^{-1}$ represents an inverse Fourier transform, and P(ρ, θ) represents the pupil function. Optics functions such as source radiance distribution S(X; ρ, θ), lens function W(X; ρ, θ), and illumination dose E(X) are tool specific and functions of only slit position X.

The resulting pattern may differ from the intended pattern that mask 26 is designed to define. For example, the resulting pattern may exhibit critical dimension errors. A critical dimension is a dimension that may be required to be defined with a high degree of accuracy. For example, a portion of a pattern that defines a transistor gate may have the width of the gate as a critical dimension. The width may be required to be defined with an accuracy of, for example, five to seven nanometers.

Critical dimension errors may result from any of a number of factors, for example, scan dynamics, which may cause errors in focusing light onto wafer 28 or tilt of wafer 28 with respect to exposure tool 10, which may be described by dynamic image field deviation ΔZ(X, Y). Other factors may include aberrations of projection lens 22 such as lens curvature or astigmatism. Factors related to the illumination of wafer 28 such as illumination uniformity and illumination source imperfection may also cause critical dimension errors.

A metrology tool 30 collects image data described by an image function CD(X, Y) from wafer 28 and maps out critical dimension distribution across an exposure field on wafer 28. Metrology tool 30 may include, for example, a scatterometer. A scatterometer may provide non-destructive, accurate, and repeatable measurements of the critical dimensions of the image. The measurements may be provided in real-time to allow for real-time data analysis that may be synchronized with an actual production process. A scatterometer may also be scalable with the increasing precision requirements.

Modifications, additions, or omissions may be made to exposure tool 10 without departing from the scope of the invention. Additionally, certain functions for characterizing exposure tool 10 may be performed using any suitable logic comprising software, hardware, other logic, or any suitable combination of the preceding.

Figure 2:
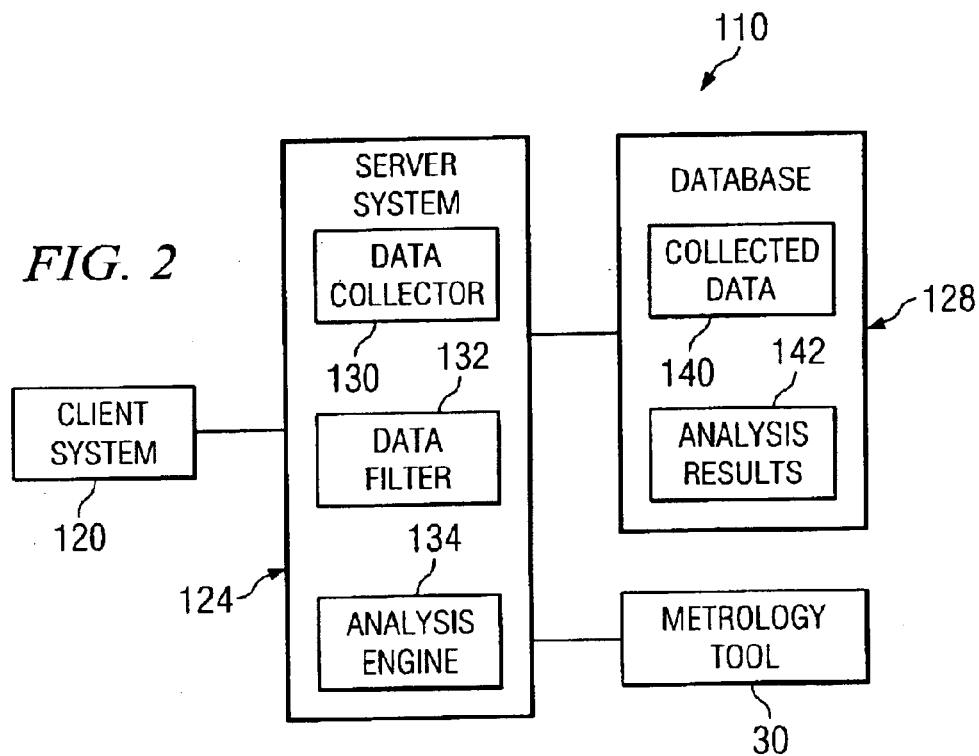
FIG. 2 is a block diagram of one embodiment of a system for characterizing an exposure tool.

FIG. 2 is a block diagram of one embodiment of a system 110 for characterizing an exposure tool. In general, system 110 collects and analyzes image data from wafer 28. An image field is mapped to determine an image field error. The image field error is removed from the data in order to reduce the data to the slit direction. Errors associated with factors other than exposure tool 10 are separated from the data in order to determine the errors associated with exposure tool 10. System 110 may weight the data at one or more steps.

According to the illustrated embodiment, system 110 includes client system 120, server system 124, and database 128 coupled as shown in FIG. 1. According to one embodiment, client system 120 allows a user to communicate with server system 124 to characterize exposure tool 10. Server system 124 manages applications that characterize exposure tool 10 such as a data collector 130, a data filter 132, and an analysis engine 134.

Data collector 130 may be used to collect data from one or more fields of wafer 28 in the slit direction X and scan direction Y. One or more sites may be sampled at each field. "Each" as used in this document refers to each member of a set or each member of a subset of a set. At each site, data may be collected in a micro-stepped manner of increments of approximately one millimeter to avoid local flatness problems. Data may also be collected in a Z direction by varying the focal plane of exposure tool 10. By collecting data in the Z direction, variations of the image field may be determined.

Data filter 132 weights the data to select data points that provide reliable information. Each data point may be weighted according to a data quality metric describing the reliability of the data point. A data quality metric may be based on, for example, a measure that describes the spread of a sample such as a range or a standard deviation. As a result of weighting, a data point that is determined to comprise an outlier data point or noise may be given a lower weighting than a data point that does not include these factors.

Data filter 132 may perform an iteratively weighted non-linear regression using a polynomial for each site and for each field in order to reduce the effects of interference such as outliers and noise. The polynomial may comprise, for example, a Taylor expansion up to the fourth order. Data filter 132 may perform one or more weighting operations. For example, weighting may be used for the image field data extraction, for the critical dimension modeling, or for both.

The following is provided as an example procedure that data filter 132 may use to weight a data point. The procedure is provided for illustration purposes only, and data filter 132 may use any other suitable procedure. According to the procedure, data filter 132 generates an initial weight function based on a matching error such as a mean square error (MSE), and then performs an iterative non-linear regression procedure on the initial weight function to generate a next weight function.

To generate the initial weight function, the median and standard deviation of the matching errors are calculated. The standard deviation may be take from a portion of the data set. For example, the standard deviation (SIGMA) may be computed from a percentile range according to Equation (3):

$$SIGMA = (\text{percentile}(MSE, 50) - \text{percentile}(MSE, 3))/2 \quad (3)$$

where percentile (MSE, X) represents the X percentage of the data points. A limit that excludes outliers is generated from the median and the standard deviation. The limit (CUTOFF) may be calculated according to Equation (4):

$$CUTOFF = \text{percentile}(MSE, 50) + 3 * SIGMA \qquad (4)$$

The initial weight function is defined as a logistic function based on the matching errors. The initial weight function $W(i, j, k)$ may be defined according to Equation (5):

$$W(i, j, k) = 1/(1 + \exp(10 * (MSE(i, j, k) - CUTOFF)/SIGMA)) \qquad (5)$$

where i designates a field of wafer 28, j represents a site within a field of wafer 28, and k represents a focus position in the Z direction.

To generate the next weight functions from the initial weight function, an iterative non-linear regression procedure may be applied to the initial weight function until a convergence criterion is satisfied. A convergence criterion may include, for example, a chi-squared criterion specifying that the iterations stop if the difference of successive chi-squared values is less than $10^{-4}$, or a focus improvement criterion specifying that the iterations stop if the difference of successive focus values improve by less than $10^{-4}$ microns. If problems are encountered during the regression procedure, the weighting function, residual variance, or convergence criteria may be adjusted in order to obtain a satisfactory weight function. Some adjustments may even be made adaptively. For example, the convergence criterion may be changed while the iterations are being performed.

Analysis engine 134 analyzes the collected data to characterize exposure tool 10. In general, analysis engine 134 identifies an image field to determine image field errors, reduces the data to the slit direction in accordance with the image field errors, and separates errors caused by other factors in order to determine across-slit errors such as errors associated with lens 22 or source 20. Errors associated with lens 22 or source 20 are typically scan invariant, that is, they do not vary in the scan direction Y. Errors that are not caused by lens 22 or source 20 such as image field error and mask error are typically scan variant, that is, they vary in the scan direction Y. By removing the scan variant errors, errors that occur in the scan direction are reduced and may be dealt with separately. Analysis engine 134 may also separate the across-slit errors into source errors that are due to source 20 and lens errors that are due to projection lens 22 using information describing source 20 and projection lens 22.

Client system 120 and server system 124 may each operate on one or more computers and may include appropriate input devices, output devices, mass storage media, processors, memory, or other components for receiving, processing, storing, and communicating information according to the operation of system 110. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client system 120 and server system 124 may be integrated or separated according to particular needs. For example, the present invention contemplates the functions of both client system 120 and server system 124 being provided using a single computer system, for example, a single personal computer. If client system 120 and server system 124 are separate, client system 120 may be coupled to server system 124 using one or more local area networks (LANs), metropolitan area networks (MANs), wide area networks (WANs), a global computer network such as the Internet, or any other appropriate wire line, wireless, or other links.

A database 128 stores data that may be used by server system 24. Database 128 may be local to or remote from server system 24, and may be coupled to server system 24 using one or more local area networks (LANs) metropolitan area networks (MANs), wide area networks (WANs), a global computer network such as the Internet, or any other appropriate wire line, wireless, or other links. Database 128 may include, for example, collected data 140 and analysis results 142.

Modifications, additions, or omissions may be made to system 110 without departing from the scope of the invention. Moreover, the operation of the system may be performed by more or fewer modules. For example, the operation of data collector 130 and data filter 132 may be performed by one module, or the operation of analysis engine 134 may be performed by more than one module. Additionally, functions may be performed using any suitable logic comprising software, hardware, other logic, or any suitable combination of the preceding.

In summary, system 110 characterizes exposure tool 10 by correlating critical dimension errors to causal factors such as scan dynamics, illumination uniformity, and lens aberrations. System 10 also quantifies the contributions of the factors to the overall across chip line variation. System 110 may be used to provide real-time analysis of exposure tool 10 that may be used to monitor and adjust production processes in order to reduce critical dimension errors.

FIG. 3 is a flowchart illustrating one embodiment of a method for characterizing an exposure tool. The method begins at step 200, where data is collected in the scan, slit, and optical axis directions. The data is weighted at step 202. The data may be weighted to reduce or remove the effect of data points that represent outliers or noise. The image field is mapped to determine the image field error at step 204. The image field error may be used to determine variation in the optical axis direction. The data may be weighted at step 206. Critical dimension modeling may be performed at step 207.

Scan-variant error is extracted from the data at step 208. Scan-variant error such as dynamic image field error and mask error is typically not due to lens 22 or source 20. Once scan-variant error is extracted, the data may be reduced to the slit direction at step 210. The data reduced to the slit direction typically describes error due to lens 22 or source 20.

The lens error is determined from the reduced data at step 212. The lens error may be determined using lens data such as a lens signature. The source error is determined from the reduced data at step 214. The source error may be determined using source data such as a source signature. The lens error and the source error are used to characterize exposure tool 10. The results are reported at step 216. After reporting the results, the method terminates.

Modifications, additions, or omissions may be made to the method without departing from the scope of the invention. For example, more or fewer weighting steps may be performed. Additionally, steps may be performed in any suitable order without departing from the scope of the invention. For example, determining source error at step 214 may be performed before determining lens error at step 212.

FIG. 4 is a diagram 300 illustrating an example context in which the method of FIG. 3 may be utilized. Diagram 300 illustrates the comparison of the results of the method described with reference to FIG. 3 to simulated results.

Referring to FIG. 4, actual across chip CD variation is generated at step 302, and actual across slit CD variation is determined at step 304. The method of FIG. 3 may be used to perform steps 302 and 304. Lens aberrations are simulated at step 310, a source profile is simulated at step 312, and a dynamic scan MSD is simulated at step 314 in order to generate a simulated slit CD variation at step 320. The across slit CD variation is compared with the simulated across slit CD variation at step 322.

Certain embodiments of the invention may provide one or more technical advantages. A technical advantage of one embodiment may be that critical dimension errors are correlated with causal factors such as scan dynamics, illumination uniformity, and lens aberrations. The contribution of each of these factors to the critical dimension errors may be quantified in order to allow for effective correction of these errors.

Although an embodiment of the invention and its advantages are described in detail, a person skilled in the art could make various alterations, additions, and omissions without departing from the spirit and scope of the present invention as defined by the appended claims.

What is claimed is:

1. A method for characterizing an exposure tool, comprising:
   receiving data describing a pattern formed at a wafer, the pattern formed by illuminating the wafer using an exposure tool, the data associated with a scan direction and slit direction;
   mapping an image field according to the data to determine an image field error of the data;
   separating the image field error from the data to reduce variation of the data in the scan direction;
   reducing the data to the slit direction; and
   determining one or more errors associated with the exposure tool from the data in order to characterize the exposure tool.

2. The method of claim 1, further comprising repeating the following until at least a portion of the wafer is illuminated:
   illuminating a slit portion of the wafer in the slit direction; and
   moving in the scan direction to illuminate a next slit portion of the wafer.

3. The method of claim 1, further comprising weighting the data comprising a plurality of data points by:
   calculating a data metric quality associated with the data points;
   generating a weighting function in accordance with the data metric quality; and
   performing an iterative regression of the data points until a fitting of the data points satisfies a predetermined convergence criterion.

4. The method of claim 1, wherein determining the one or more errors associated with the exposure tool comprises:
   accessing mask data describing a mask error; and
   separating the mask error from the data in accordance with the mask data to determine an error associated with the exposure tool.

5. The method of claim 1, wherein determining the one or more errors associated with the exposure tool comprises:
   accessing lens data describing a lens error; and
   separating the lens error from the data in accordance with the lens data to determine an error associated with the exposure tool.

6. The method of claim 1, wherein determining the one or more errors associated with the exposure tool comprises:
   accessing known error data describing a known error; and
   separating the known error from the data in accordance with the known error data to determine an error associated with the exposure tool.

7. A system for characterizing an exposure tool, comprising:
   a database operable to store data describing a pattern formed at a wafer, the pattern formed by illuminating the wafer using an exposure tool, the data associated with a scan direction and slit direction; and
   a server coupled to the database and operable to:
      map an image field according to the data to determine an image field error of the data;
      separate the image field error from the data to reduce variation of the data in the scan direction;
      reduce the data to the slit direction; and
      determine one or more errors associated with the exposure tool from the data in order to characterize the exposure tool.

8. The system of claim 7, the server further operable to repeat the following until at least a portion of the wafer is illuminated:
   illuminating a slit portion of the wafer in the slit direction; and
   moving in the scan direction to illuminate a next slit portion of the wafer.

9. The system of claim 7, the server further operable to weight the data comprising a plurality of data points by:
   calculating a data metric quality associated with the data points;
   generating a weighting function in accordance with the data metric quality; and
   performing an iterative regression of the data points until a fitting of the data points satisfies a predetermined convergence criterion.

10. The system of claim 7, the server operable to determine the one or more errors associated with the exposure tool by:
    accessing mask data describing a mask error; and
    separating the mask error from the data in accordance with the mask data to determine an error associated with the exposure tool.

11. The system of claim 7, the server operable to determine the one or more errors associated with the exposure tool by:
    accessing lens data describing a lens error; and
    separating the lens error from the data in accordance with the lens data to determine an error associated with the exposure tool.

12. The system of claim 7, the server operable to determine the one or more errors associated with the exposure tool by:
    accessing known error data describing a known error; and
    separating the known error from the data in accordance with the known error data to determine an error associated with the exposure tool.

13. Logic for characterizing an exposure tool, the logic embodied in a medium and operable to:
    receive data describing a pattern formed at a wafer, the pattern formed by illuminating the wafer using an exposure tool, the data associated with a scan direction and slit direction;

map an image field according to the data to determine an image field error of the data;

separate the image field error from the data to reduce variation of the data in the scan direction;

reduce the data to the slit direction; and determine one or more errors associated with the exposure tool from the data in order to characterize the exposure tool.

14. The logic of claim 13, further operable to repeat the following until at least a portion of the wafer is illuminated:

illuminating a slit portion of the wafer in the slit direction; and moving in the scan direction to illuminate a next slit portion of the wafer.

15. The logic of claim 13, further operable to weight the data comprising a plurality of data points by:

calculating a data metric quality associated with the data points;

generating a weighting function in accordance with the data metric quality; and performing an iterative regression of the data points until a fitting of the data points satisfies a predetermined convergence criterion.

16. The logic of claim 13, operable to determine the one or more errors associated with the exposure tool by:

accessing mask data describing a mask error; and separating the mask error from the data in accordance with the mask data to determine an error associated with the exposure tool.

17. The logic of claim 13, operable to determine the one or more errors associated with the exposure tool by:

accessing lens data describing a lens error; and separating the lens error from the data in accordance with the lens data to determine an error associated with the exposure tool.

18. The logic of claim 13, operable to determine the one or more errors associated with the exposure tool by:

accessing known error data describing a known error; and separating the known error from the data in accordance with the known error data to determine an error associated with the exposure tool.

19. A system for characterizing an exposure tool, comprising:

means for receiving data describing a pattern formed at a wafer, the pattern formed by illuminating the wafer using an exposure tool, the data associated with a scan direction and slit direction;

means for mapping an image field according to the data to determine an image field error of the data;

means for separating the image field error from the data to reduce variation of the data in the scan direction;

means for reducing the data to the slit direction; and means for determining one or more errors associated with the exposure tool from the data in order to characterize the exposure tool.

20. A method for characterizing an exposure tool, comprising:

receiving data describing a pattern formed at a wafer, the pattern formed by illuminating the wafer using an exposure tool, the data associated with a scan direction and slit direction, the wafer illuminated by repeating the following until at least a portion of the wafer is illuminated: illuminating a slit portion of the wafer in the slit direction, and moving in the scan direction to illuminate a next slit portion of the wafer;

weighting the data comprising a plurality of data points by: calculating a data metric quality associated with the data points, generating a weighting function in accordance with the data metric quality, and performing an iterative regression of the data points until a fitting of the data points satisfies a predetermined convergence criterion;

mapping an image field according to the data to determine an image field error of the data;

separating the image field error from the data to reduce variation of the data in the scan direction;

reducing the data to the slit direction; and determining one or more errors associated with the exposure tool from the data in order to characterize the exposure tool by accessing mask data describing a mask error, lens data describing a lens error, and known error data describing a known error, and by separating the mask error, the lens error, and the known error from the data to determine an error associated with the exposure tool.

* * * * *